United States Patent
Kudymov et al.

(10) Patent No.: US 9,525,055 B2
(45) Date of Patent: Dec. 20, 2016

(54) HIGH-ELECTRON-MOBILITY TRANSISTORS

(71) Applicant: POWER INTEGRATIONS, INC., San Jose, CA (US)

(72) Inventors: Alexey Kudymov, Ringoes, NJ (US); Jamal Ramdani, Raritan, NJ (US); Linlin Liu, Hillsborough, NJ (US)

(73) Assignee: POWER INTEGRATIONS. INC., San Jose, CA (US)

( * ) Notice: Subject to any disclaimer, the term of this patent is extended or adjusted under 35 U.S.C. 154(b) by 0 days.

(21) Appl. No.: 15/062,313

(22) Filed: Mar. 7, 2016

(65) Prior Publication Data

US 2016/0190297 A1   Jun. 30, 2016

Related U.S. Application Data

(63) Continuation of application No. 14/581,645, filed on Dec. 23, 2014, now Pat. No. 9,306,014.

(Continued)

(51) Int. Cl.
*H01L 29/778* (2006.01)
*H01L 29/40* (2006.01)
*H01L 29/20* (2006.01)
*H01L 29/205* (2006.01)
*H01L 29/66* (2006.01)
*H01L 29/51* (2006.01)

(52) U.S. Cl.
CPC ....... *H01L 29/7787* (2013.01); *H01L 29/2003* (2013.01); *H01L 29/205* (2013.01);
(Continued)

(58) Field of Classification Search
CPC .. H01L 29/778; H01L 29/7787; H01L 29/205; H01L 29/404; H01L 29/7786; H01L 29/518; H01L 29/66462
(Continued)

(56) References Cited

U.S. PATENT DOCUMENTS 7,052,942 B1 * 5/2006 Smart ................. H01L 29/7787
257/194
7,078,743 B2 * 7/2006 Murata ............... H01L 29/7787
257/12

(Continued)

FOREIGN PATENT DOCUMENTS

EP   2 772 940 A2   9/2014
EP   2 779 247 A2   9/2014

OTHER PUBLICATIONS

Extended European Search Report issued Aug. 31, 2016 in connection with corresponding European Patent Application No. 15202460.0 (10 pages total).

*Primary Examiner* — Nathan W Ha
(74) *Attorney, Agent, or Firm* — Stuart H. Mayer; Mayer & Williams PC

(57) ABSTRACT

High-electron-mobility transistors that include field plates are described. In a first implementation, a HEMT includes a first and a second semiconductor material disposed to form a heterojunction at which a two-dimensional electron gas arises and source, a drain, and gate electrodes. The gate electrode is disposed to regulate conduction in the heterojunction between the source electrode and the drain electrode. The gate has a drain-side edge. A gate-connected field plate is disposed above a drain-side edge of the gate electrode and extends laterally toward the drain. A second field plate is disposed above a drain-side edge of the gate-connected field plate and extends laterally toward the drain.

13 Claims, 10 Drawing Sheets

Related U.S. Application Data

(60) Provisional application No. 61/921,140, filed on Dec. 27, 2013.

(52) U.S. Cl.
CPC ........ *H01L 29/404* (2013.01); *H01L 29/7786* (2013.01); *H01L 29/518* (2013.01); *H01L 29/66462* (2013.01)

(58) Field of Classification Search
USPC ........................................................ 257/192
See application file for complete search history.

(56) References Cited

U.S. PATENT DOCUMENTS

| | | | |
|---|---|---|---|
| 7,355,215 B2* | 4/2008 | Parikh | H01L 27/0605 257/192 |
| 7,388,236 B2* | 6/2008 | Wu | H01L 29/404 257/192 |
| 7,419,892 B2* | 9/2008 | Sheppard | H01L 21/046 257/183 |
| 2009/0146186 A1 | 6/2009 | Kub et al. | |
| 2009/0267078 A1 | 10/2009 | Mishra et al. | |
| 2010/0044752 A1* | 2/2010 | Marui | H01L 29/7787 257/192 |
| 2011/0049526 A1 | 3/2011 | Chu et al. | |
| 2011/0147798 A1 | 6/2011 | Radosavljevic et al. | |
| 2012/0175681 A1 | 7/2012 | Stevens et al. | |
| 2013/0015466 A1 | 1/2013 | Miyoshi et al. | |
| 2013/0099284 A1 | 4/2013 | Tserng et al. | |
| 2013/0256681 A1 | 10/2013 | Wang et al. | |
| 2014/0159050 A1 | 6/2014 | Yoon et al. | |
| 2014/0209918 A1 | 7/2014 | Chen et al. | |
| 2015/0060873 A1 | 3/2015 | Chiu et al. | |
| 2015/0132932 A1 | 5/2015 | Green et al. | |

* cited by examiner

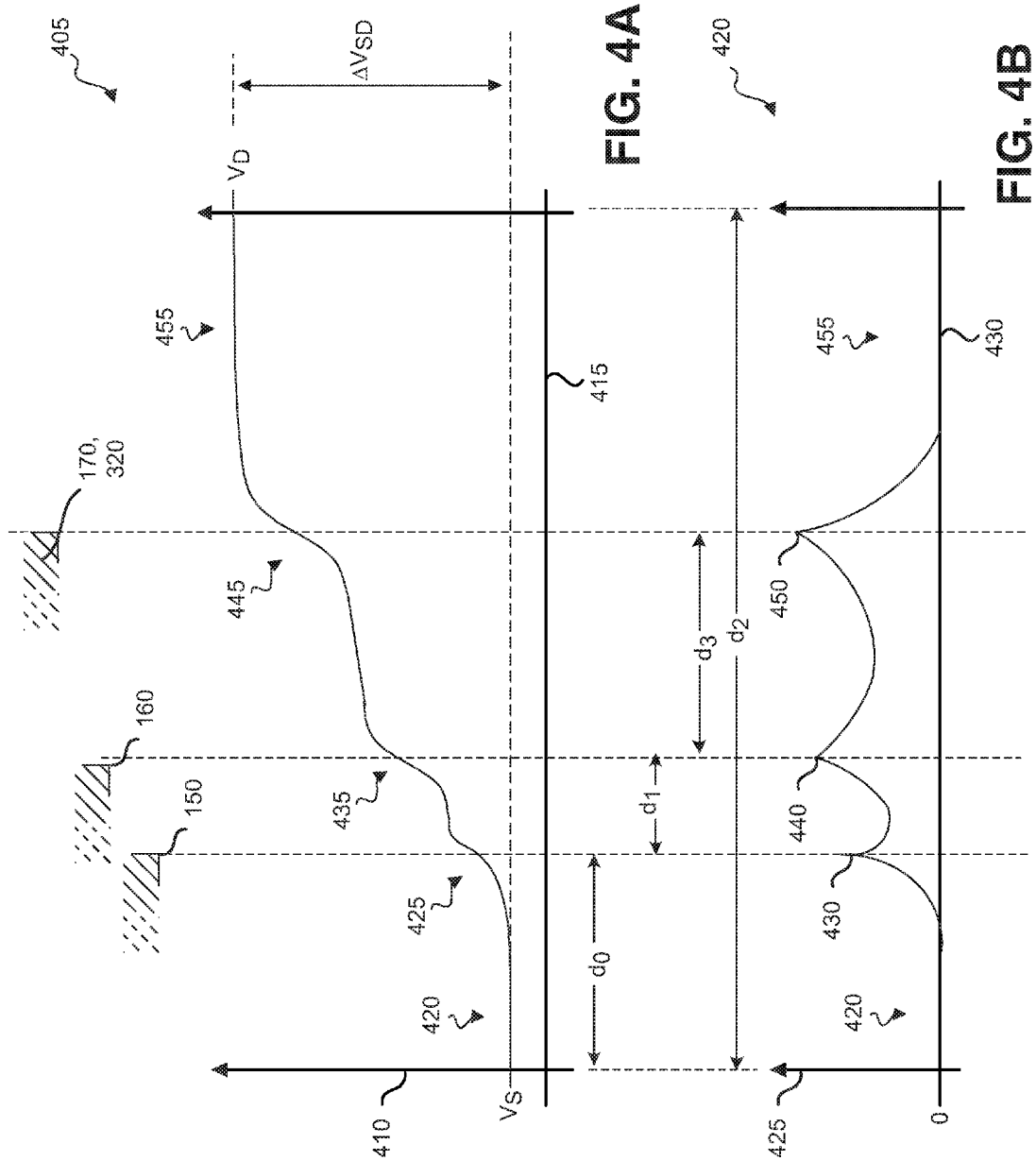

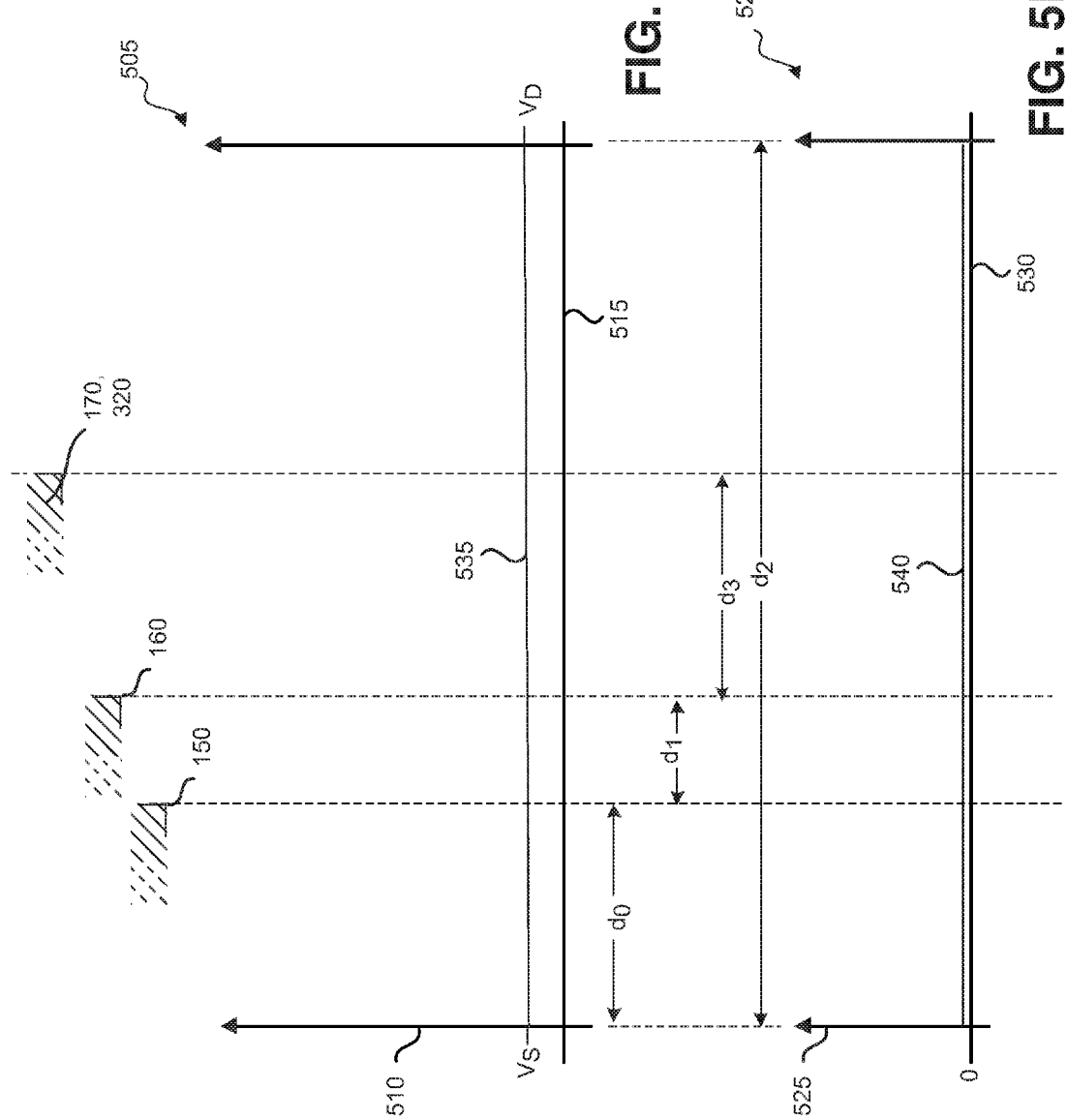

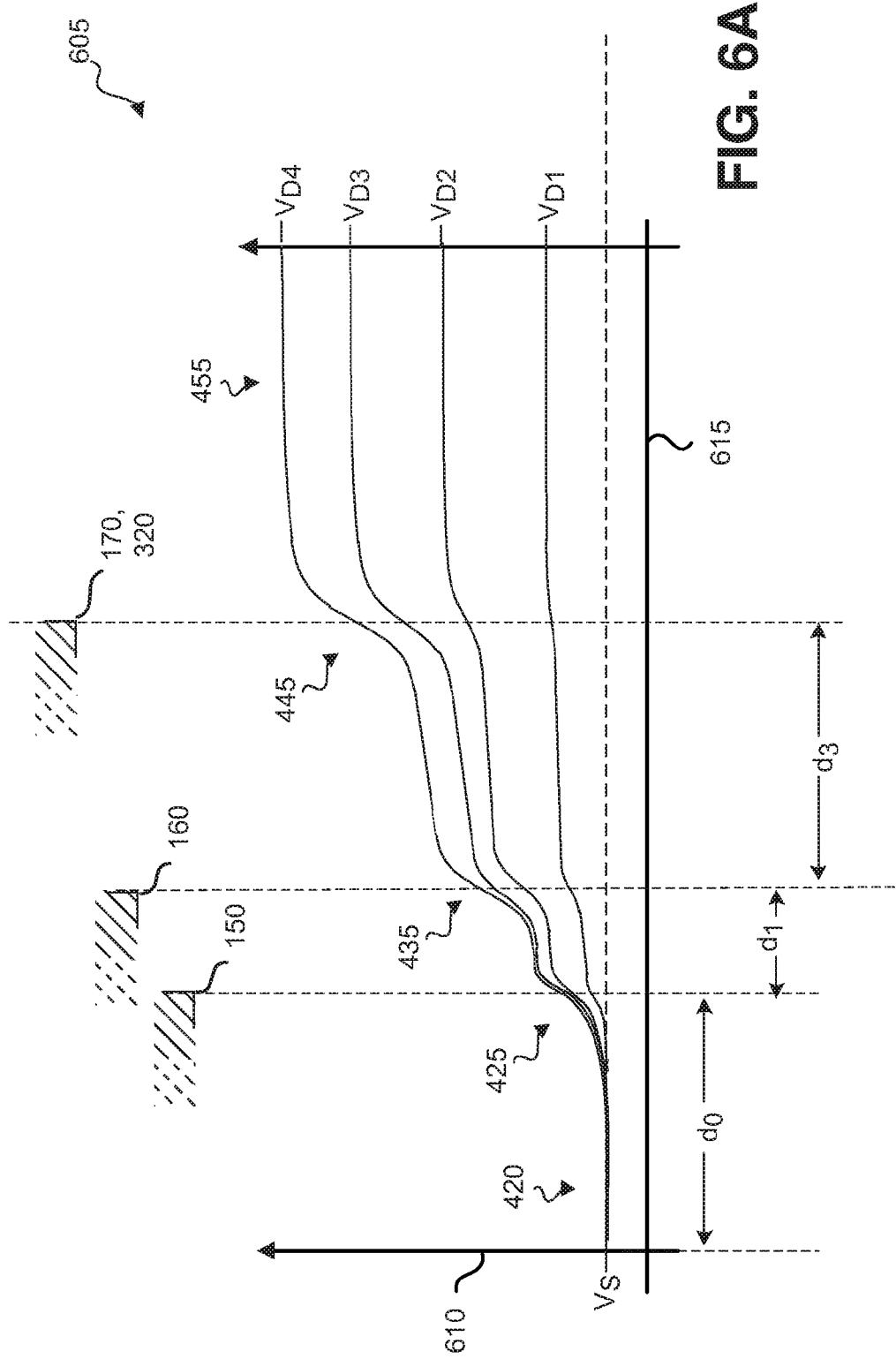

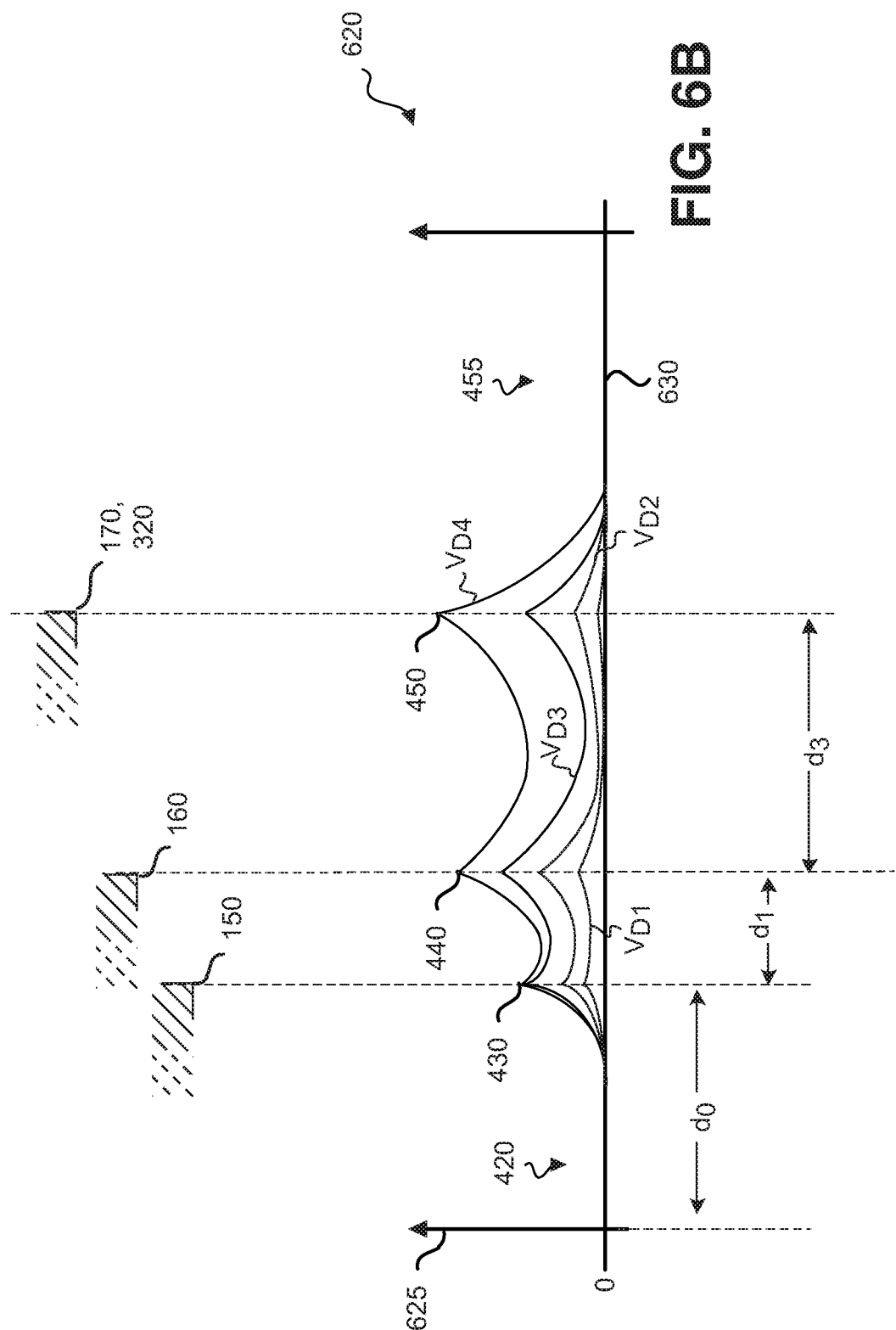

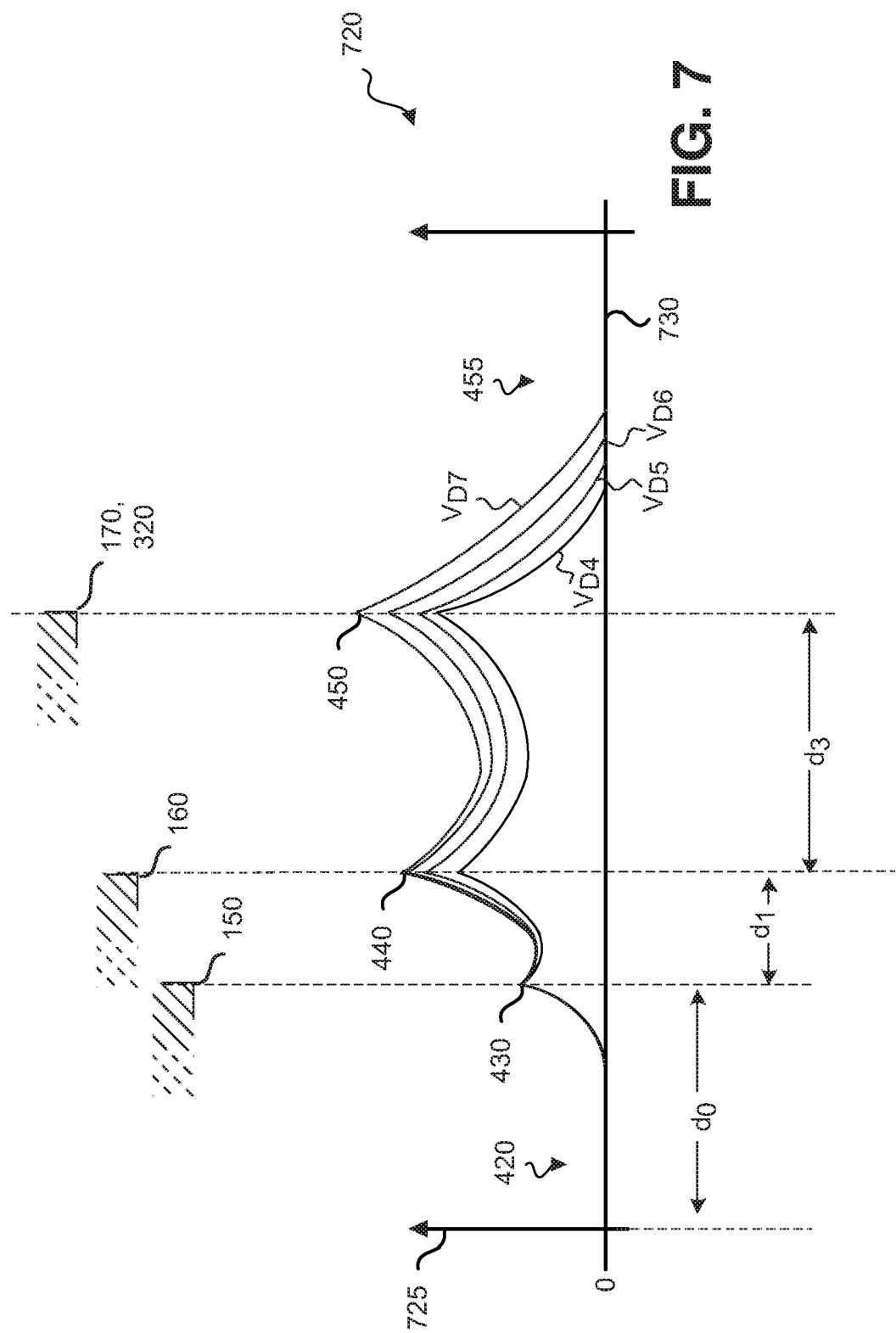

HIGH-ELECTRON-MOBILITY TRANSISTORS

CROSS-REFERENCE TO RELATED APPLICATIONS

This application is a continuation of U.S. patent application Ser. No. 14/581,645, filed Dec. 23, 2014, entitled, "HIGH-ELECTRON-MOBILITY TRANSISTORS", which claims benefit and priority to U.S. Provisional Application Ser. No. 61/921,140, filed Dec. 27, 2013, the entire contents of which are incorporated herein by reference.

TECHNICAL FIELD

This specification relates to high-electron-mobility transistors, in particular, to the design of field plates and other components of high-electron-mobility transistors.

BACKGROUND

High-electron-mobility transistors (HEMTs), also known as heterostructure field effect transistors (HFETs), are field-effect transistors that include a heterojunction that acts as the transistor channel. In HEMTs, conduction of a "two-dimensional electron gas" in the heterojunction channel is regulated by a gate.

Despite invention in the late 1970's and the commercial success of HEMTs in applications such as, e.g., millimeter wave switching, commercial development of some HEMTs, e.g., gallium nitride-based HEMTs for power electronics has been slower than desired.

Field plates are conductive elements that have commonly been used to modify the profile of electric fields in semiconductor devices. In general, field plates are designed to reduce the peak values of electric fields in semiconductor devices, hence improving the breakdown voltages and lifespans of the devices that include field plates.

In HEMTs (e.g., gallium nitride-based HEMTs), it is believed that field plates also reduce a parasitic effect commonly referred to as "dc-to-rf dispersion" or "drain current-collapse." During relatively higher frequency (e.g., radio frequency) operation, devices suffering from this parasitic effect reach lower drain current levels than the drain current levels reached during direct current (dc) operation. The parasitic effect is believed to be due to the relatively slow response times of interfacial states.

Experimental investigations into the length of field plates in HEMTs have been conducted. For example, researchers have described that, in some HEMT devices, breakdown voltage approaches a maximum value (i.e., "saturates") after gate-connected field plates extend a certain distance toward the drain. Further extension of gate-connected field plates beyond the saturation length toward the drain yields little or no improvement in breakdown voltage. Since the input capacitance of the gate increases with proximity of a gate-connected field plate to the drain, it has been recommended that the extension of gate-connected field plates toward drains be limited once the saturation length is reached.

SUMMARY

High-electron-mobility transistors that include field plates are described. In a first implementation, a HEMT includes a first semiconductor material and a second semiconductor material disposed to form a heterojunction at which a two-dimensional electron gas arises, a source electrode, a drain electrode, and a gate electrode, the gate electrode disposed to regulate conduction in the heterojunction between the source electrode and the drain electrode, the gate having a drain-side edge, a gate-connected field plate disposed above a drain-side edge of the gate electrode and extending laterally toward the drain, and a second field plate disposed above a drain-side edge of the gate-connected field plate and extending laterally toward the drain.

In a second implementation, a HEMT includes a first semiconductor material and a second semiconductor material disposed to form a heterojunction at which a two-dimensional electron gas arises, a source electrode, a drain electrode, and a gate electrode, the gate electrode disposed to regulate conduction in the heterojunction between the source electrode and the drain electrode, the gate having a drain-side edge, a gate-connected field plate disposed above a drain-side edge of the gate electrode and extending laterally toward the drain, and a second field plate disposed above a drain-side edge of the gate-connected field plate and extending laterally toward the drain. In the OFF state, a first electric field in the heterojunction extends drain-ward from a drain-side edge of the gate-connected field plate, a second electric field in the heterojunction extends source-ward from a drain-side edge of the second field plate, and the first electric field first overlaps with the second electric field only at potential differences between the source and the drain that exceed a potential difference between the source and the drain at which charge carriers are depleted from a portion of the heterojunction in a vicinity of the drain-side edge of the second field plate.

In a third implementation, a semiconductor device includes a substrate, a first active layer disposed over the substrate, a second active layer disposed on the first active layer such that a lateral conductive channel arises between the first active layer and the second active layer, a source and drain electrode, a first passivation layer disposed over the second active layer, a gate electrode disposed over the first passivation layer, a second passivation layer disposed over the gate electrode, a gate field plate extending a first distance beyond an edge of the gate electrode nearest to the drain electrode, a third passivation layer disposed over the first metal pattern, and a second field plate electrically connected to one of the source electrode and the gate electrode and extending a second distance beyond an edge of the gate field plate nearest to the drain electrode. An edge of the second field plate is separated by a third distance from a first extension of the drain electrode adjacent to the second field plate. The first distance is selected such that a gate edge field increment is cut off when a portion of the lateral conducting channel under the gate electrode is pinched off for a first drain bias greater than an absolute value of an available gate swing amplitude above a lower threshold.

Each of the first, the second, and the third implementations can include one or more of the following features. In the OFF state and at a potential difference between the source and the drain in excess of the absolute value of a gate swing amplitude, charge carriers are depleted from a portion of the heterojunction in a vicinity of the drain-side edge of the gate-connected field plate, the depletion of charge carriers effective to saturate a lateral electric field in the heterojunction in a vicinity of the drain-side edge of the gate electrode. The charge carriers can be depleted at a potential difference between the source and the drain of between 2-5 times the absolute value of the gate swing amplitude. For example, the charge carriers are depleted at a potential difference between the source and the drain of between 3-4 times the absolute value of the gate swing amplitude.

In the OFF state and at a potential difference between the source and the drain in excess of the potential difference at which charge carriers are depleted from the portion of the heterojunction in the vicinity of the drain-side edge of the gate-connected field plate, charge carriers can be depleted from a portion of the heterojunction in a vicinity of the drain-side edge of the second field plate, the depletion of charge carriers effective to saturate a lateral electric field in the heterojunction in a vicinity of the drain-side edge of the gate-connected field plate. For example, the potential difference at which charge carriers are depleted from a portion of the heterojunction in a vicinity of the drain-side edge of the second field plate is between three and five times the potential difference at which charge carriers are depleted from the portion of the heterojunction in the vicinity of the drain-side edge of the gate-connected field plate. For example, in the OFF state: a first electric field in the heterojunction extends drain-ward from a drain-side edge of the gate-connected field plate; a second electric field in the heterojunction extends source-ward from a drain-side edge of the second field plate; and the first electric field first overlaps with the second electric field only at potential differences between the source and the drain that exceed a potential difference between the source and the drain at which charge carriers are depleted from a portion of the heterojunction in a vicinity of the drain-side edge of the second field plate.

A HEMT or semiconductor device can include a third field plate disposed above a drain-side edge of the second field plate and extending laterally toward the drain. In the OFF-state and at potential differences between the source and the drain that exceed a potential difference between the source and the drain at which charge carriers are depleted from a portion of the heterojunction in a vicinity of the drain-side edge of the second field plate, a portion of the heterojunction in a vicinity of the drain is depleted due to the vertically-oriented voltage difference between the heterojunction and the third field plate. The third field plate can be a source-connected field plate.

In a HEMT or semiconductor device in the OFF state: a first electric field in the heterojunction can extend drain-ward from a drain-side edge of the gate-connected field plate, a second electric field in the heterojunction extends source-ward from a drain-side edge of the second field plate, and the first electric field first overlaps with the second electric field only at potential differences between the source and the drain that exceed a potential difference between the source and the drain at which charge carriers are depleted from a portion of the heterojunction in a vicinity of the drain-side edge of the second field plate. The first electric field can first overlap with the second electric field only at potential differences between the source and the drain at potential differences between the source and the drain that exceed a potential difference between the source and the drain at which charge carriers are depleted from a portion of the heterojunction in a vicinity of the drain-side edge of the second field plate.

A HEMT or semiconductor device can include one or more layers of insulating material above the first and second semiconductor material and a sheet carrier density can arise at the heterojunction. After a steady state is reached after extended operation at specified operational parameters, a number of charge defects per unit area in the layers of insulating material is less than the sheet carrier density. For example, the number of charge defects per unit area in the layers of insulating material can be less than 10% of the sheet carrier density.

A HEMT or semiconductor device can include GaN and AlGaN. A HEMT or semiconductor device can include an aluminum silicon nitride layer to isolate the gate electrode from the second semiconductor material.

In a HEMT or semiconductor device in the OFF state and at potential differences between the source and the drain that exceed a potential difference between the source and the drain at which charge carriers are depleted from a portion of the heterojunction in a vicinity of the drain-side edge of the second field plate, a portion of the heterojunction in a vicinity of the drain is depleted due to the vertically-oriented voltage difference between the heterojunction and the third field plate.

In a HEMT or semiconductor device in the OFF state, a source and drain electrode can be disposed over the second active layer. A gate field plate can be defined by a first metal pattern disposed on the second passivation layer, the first metal pattern extending laterally over all of the gate electrode. A second field plate can be a source field plate defined by a second metal pattern disposed on the third passivation layer. A second metal pattern can be electrically connected to the source electrode and extends laterally over all of the first metal pattern and further extends the second distance beyond an edge of the first metal pattern nearest to the drain electrode. An edge of the second metal pattern can be separated by the third distance from the first extension of the drain electrode adjacent to the second metal pattern.

A HEMT or semiconductor device can include a fourth passivation layer disposed over the second metal pattern, a shield wrap defined by a third metal pattern disposed on the fourth passivation layer. The third metal pattern can be electrically connected to the source electrode and extending laterally over a majority of the lateral conductive channel such that the third metal pattern has an edge a third distance from a second extension of the drain electrode adjacent to the third metal pattern. An edge-to-edge distance between the third metal pattern and the second extension of the drain electrode can be between 2 and 6 microns. A thickness of the fourth passivation layer can be between 0.5 and 2 microns. The first drain bias can be about 2-5 times greater than the absolute value of the available gate swing amplitude above a threshold. The second distance can be sufficient to provide a cut-off for an edge field of the gate field plate for a second drain bias greater than a cut-off bias of a gate edge field provided by the gate field plate when a portion of the lateral conducting channel under the gate electrode is pinched off. For example, the second drain bias can be about 2.5-10 times greater than the first drain bias. The second distance can be at least sufficiently long such that a lateral depletion extension under the second metal pattern should not reach an edge of the second metal pattern before the lateral conducting channel is pinched off vertically under the edge of the second metal pattern nearest to the drain edge. The first distance can be between 1.5 and 3.5 microns. The second distance can be between 2.5 and 7.5 microns, the third distance can be between 2 and 6 microns. An edge-to-edge distance between the gate electrode and the drain electrode can be between 8 and 26 microns. A thickness of the third passivation layer can be between 0.35 and 0.75 microns.

BRIEF DESCRIPTION OF THE DRAWINGS

FIGS. 4A, 4B are graphs that schematically represent, respectively, the voltage and electric field at the heterojunction between the source and the drain of some implementations of HEMTs in an OFF-state.

FIGS. 5A, 5B are graphs that schematically represent, respectively, the voltage and electric field at the heterojunction between the source and the drain of some implementations of HEMTs in an ON-state.

FIGS. 6A, 6B are graphs that schematically represent, respectively, the voltage and electric field at the heterojunction between the source and the drain of some implementations of HEMTs in an OFF-state for fixed source and gate potential but a variety of different discrete drain potentials.

FIG. 7 is a graph that schematically represents the electric field at the heterojunction between the source and the drain of some implementations of HEMTs in an OFF-state for fixed source and gate potential but a variety of different discrete drain potentials.

DETAILED DESCRIPTION

Figure 1:
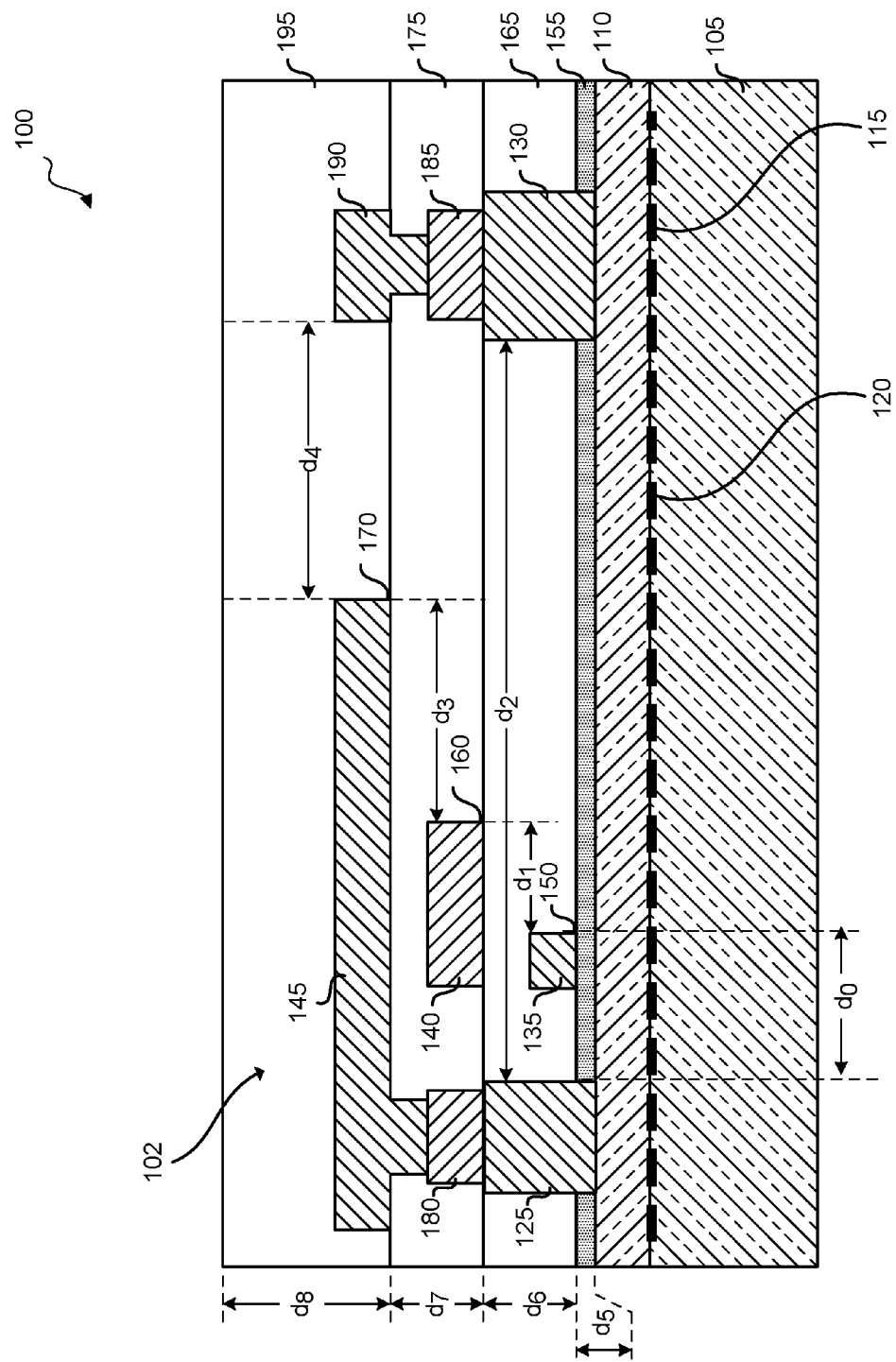
FIG. 1 is a schematic representation of cross-sectional view of a lateral-channel HEMT.

FIG. 1 is a schematic representation of cross-sectional view of a lateral-channel HEMT 100. HEMT 100 includes a first semiconductor material 105 and a second semiconductor material 110 that contact one another to form a heterojunction 115. Due to the material properties of semiconductor materials 105, 110, a two-dimensional electron gas 120 arises at heterojunction 115. HEMT 100 also includes a source electrode 125, a drain electrode 130, and a gate electrode 135. The selective biasing of gate electrode 135 regulates the conductivity between source electrode 125 and drain electrode 130.

HEMT 100 also includes a vertically-layered field plate structure 102. In the illustrated implementation, field plate structure 102 is a dual-field plate structure that includes a gate-connected field plate 140 and a source-connected field plate 145. Gate-connected field plate 140 is electrically connected to gate electrode 135. Source-connected field plate 145 is electrically coupled to source electrode 125.

In the illustrated implementation, gate electrode 135, gate-connected field plate 140, and source-connected field plate 145 each has a generally rectangular cross-section. Gate electrode 135 includes a bottom, drain-side edge 150. Drain-side edge 150 is disposed a lateral distance d0 towards drain electrode 130 from a side of source electrode 125 and a vertical distance d5 above second semiconductor material 110. Drain-side edge 150 is vertically separated from second semiconductor material 110 by a first layer of insulating material 155. Gate-connected field plate 140 includes a bottom, drain-side edge 160. Drain-side edge 160 is disposed a lateral distance d0+d1 towards drain electrode 130 from a side of source electrode 125 and a vertical distance d5+d6 above second semiconductor material 110. Drain-side edge 160 is vertically separated from second semiconductor material 110 by both the first layer of insulating material 155 and a second layer of insulating material 165. Source-connected field plate 145 includes a bottom, drain-side edge 170. Drain-side edge 170 is disposed a lateral distance d0+d1+d3 towards drain electrode 130 from a side of source electrode 125 and a vertical distance d5+d6+d7 above second semiconductor material 110. Drain-side edge 170 is vertically separated from second semiconductor material 110 by the first layer of insulating material 155, the second layer of insulating material 165, and a third layer of insulating material 175. As discussed further below, electric fields between each of gate electrode 135, gate-connected field plate 140, and source-connected field plate 145 and heterojunction 115 are highest at the respective of edges 150, 160, 170 under certain bias conditions.

Gate electrode 135 can be electrically connected to gate-connected field plate 140 in a variety of different ways. In the illustrated implementation, the connection between gate electrode 135 and gate-connected field plate 140 is outside of the cross-section. In other implementations, gate electrode 135 and gate-connected field plate 140 can be formed by a unitary member having a generally L-shaped cross-section that would appear in the illustrated implementation.

Source electrode 125 can be electrically connected to source-connected field plate 145 in a variety of different ways. In the illustrated implementation, source electrode 125 is electrically connected to source-connected field plate 145 by a source via member 180. In other implementations, source electrode 125 can be electrically connected to source-connected field plate 145 outside of the illustrated cross-section.

In the illustrated implementation, drain 130 is electrically connected to a pair of drain via members 185, 190. Drain via members 185, 190 extend through third layer of insulating material 175 to a same vertical level as source-connected field plate 145, thus acting as extensions of drain 130. Via member 190, by virtue of being on the same vertical level as source-connected field plate 145, is the nearest extension of drain 130 to source-connected field plate 145. The side of source-connected field plate 145 that includes bottom, drain-side edge 170 is disposed a lateral distance d4 away from the drain via member 190 at the same vertical level. In some implementations, lateral distance d4 is no greater than that needed to maintain a device-specific lateral dielectric breakdown voltage for a device-specific device lifetime. In the illustrated implementation, source-connected field plate 145 and drain via member 190 are covered by a fourth layer of insulating material 195. Fourth layer of insulating material 195 extends a distance d8 from a top surface of third layer of insulating material 175.

In the illustrated implementation, source electrode 125 and drain electrode 130 both rest directly on an upper surface of second semiconductor material 110 to make electrical contact therewith. This is not necessarily the case. For example, in some implementations, source electrode 125 and/or drain electrode 130 penetrate into second semiconductor material 110. In some implementations, this penetration is deep enough that source electrode 125 and/or drain electrode 130 contact or even pass through heterojunction 115. As another example, in some implementations, one or more interstitial glue metal or other conductive materials are disposed between source electrode 125 and/or drain electrode 130 and one or both of semiconductor materials 105, 110.

In the illustrated implementation, gate electrode 135 is electrically insulated from second semiconductor material 110 by a single electrically-insulating layer 155 having a uniform thickness d5. This is not necessarily the case. For example, in other implementations, a multi-layer can be used to insulate gate electrode 135 from second semiconductor material 110. As another example, a single or multi-layer having a non-uniform thickness can be used to insulate gate electrode 135 from second semiconductor material 110.

The various features of lateral-channel HEMT 100 can be made from a variety of different materials. For example, first semiconductor material 105 can be GaN, InN, Aln, AlGaN, InGaN, AlIn-Gan. In some implementations, first semiconductor material 105 can also include compound semiconductors containing arsenic such as one or more of, e.g., GaAs, InAs, AlAs, InGaAs, AlGaAs, InAlGaAs. Second semiconductor material 110 can be, e.g., AlGaN, GaN, InN, Aln, InGaN, AlIn-GaN. Second semiconductor material 110 can also include compound semiconductors containing arsenic such as one or more of GaAs, InAs, AlAs, InGaAs, AlGaAs, InAlGaAs. The compositions of first and second semiconductor materials 105, 110—which also can be referred to as "active layers"—are tailored such that two-dimensional electron gas 120 forms at heterojunction 115. For example, in some implementations, the compositions of first and second semiconductor materials 105, 110 can be tailored such that a sheet carrier density of between $10^{11}$ to $10^{14}$ cm$^{-2}$ arises at heterojunction 115, e.g., between $5\times10^{12}$ to $5\times10^{13}$ cm$^{-2}$ or between $8\times10^{12}$ to $1.2\times10^{13}$ cm$^{-2}$ arises at heterojunction 115. Semiconductor materials 105, 110 can be formed above a substrate, e.g., above a gallium nitride, gallium arsenide, silicon carbide, sapphire, silicon, or other substrate. Semiconductor material 105 can either be in direct contact with such a substrate or one or more intervening layers can be present.

Source electrode 125, drain electrode 130, and gate electrode 135 can be made from various electrical conductors including, e.g., metals such as Al, Ni, Ti, TiW, TiN, TiAu, TiAlMoAu, TiAlNiAu, TiAlPtAu, or the like. First layer of insulating material 155 can be made from various dielectrics suitable for forming a gate insulator including, e.g., aluminum oxide ($Al_2O_3$), zirconium dioxide ($ZrO_2$), aluminum nitride (AlN), hafnium oxide ($HfO_2$), silicon dioxide ($SiO_2$), silicon nitride ($Si_3N_4$), aluminum silicon nitride (AlSiN), or other suitable gate dielectric materials. Second, third, and fourth layers of insulating material 165, 175, 195 can be made from various dielectrics including, e.g., silicon nitride, silicon oxide, silicon oxynitride, or the like. First, second, third, and fourth layers of insulating material 155, 165, 175, 195 can also be referred to as "passivation layers" in that layers 155, 165, 175, 195 each hinder or prevent the formation and/or charging of surface states in the respective of underlying second semiconductor material 110 or layers 155, 165, 175.

In some implementations, second, third, and fourth layers of insulating material 165, 175, 195 have a composition and quality tailored so that—after extended operation at specified operational parameters so that a steady state is reached—the number of charge defects per area in insulating material layers 165, 175, 195 is less than the sheet carrier density at the heterojunction. In other words, the sum of the products of each three-dimensional defect density of insulating material layers 165, 175, 195 and the respective thickness of that layer is less than the (two-dimensional) sheet carrier density at heterojunction 115. For example, in some implementations, the number of charge defects per area in insulating material layers 165, 175, 195 is less than 20%, or less than 10%, of the sheet carrier density at heterojunction 115. In some implementations, HEMT 100 and the other HEMTs described herein include an interlayer, e.g., an AlN interlayer.

Source electrode 125 is disposed a lateral distance from the d2 from drain electrode 130. In some implementations, lateral distance d2 is between 5 and 50 micrometers, e.g. between 9 and 30 micrometers. In some implementations, lateral distance d1 is between 1 and 5 micrometers, e.g., between 1.5 and 3.5 micrometers. In some implementations, the thickness of third layer of insulating material 175 is between 0.2 and 1 micrometers, e.g., between 0.35 and 0.75 micrometers. In some implementations, lateral distance d4 is between 1 and 8 micrometers, e.g., between 2 and 6 micrometers. In some implementations, the thickness of fourth layer of insulating material 195 is between 0.4 and 3 micrometers, e.g., between 0.5 and 2 micrometers. In some implementations, lateral distance d3 is between 1 and 10 micrometers, e.g., between 2.5 and 7.5 micrometers.

Figure 2:
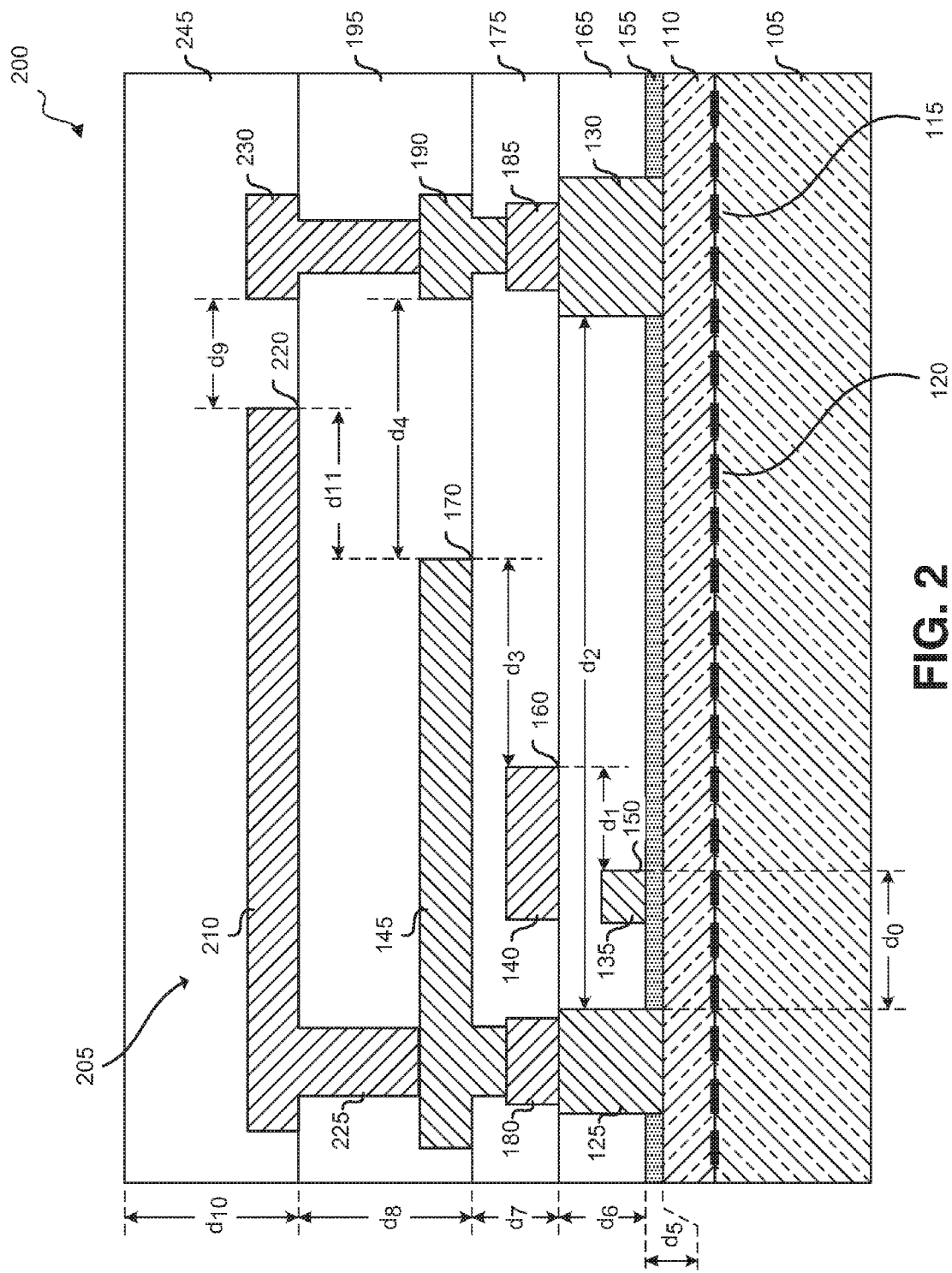
FIG. 2 is a schematic representation of cross-sectional view of a lateral-channel HEMT.

FIG. 2 is a schematic representation of cross-sectional view of a lateral-channel HEMT 200. In addition to semiconductor materials 105, 110, electrodes 125, 130, 135, and via members 180, 185, 190, HEMT 200 includes a vertically-layered field plate structure 205. Field plate structure 205 is a treble-field plate structure that includes not only gate-connected field plate 140 and source-connected field plate 145 but also a second source-connected plate 210. Second source-connected plate 210 is electrically connected to source electrode 125. Second source-connected plate 210 covers gate electrode 135, gate field plate 140, and source-connected field plate 145.

Figure 3:
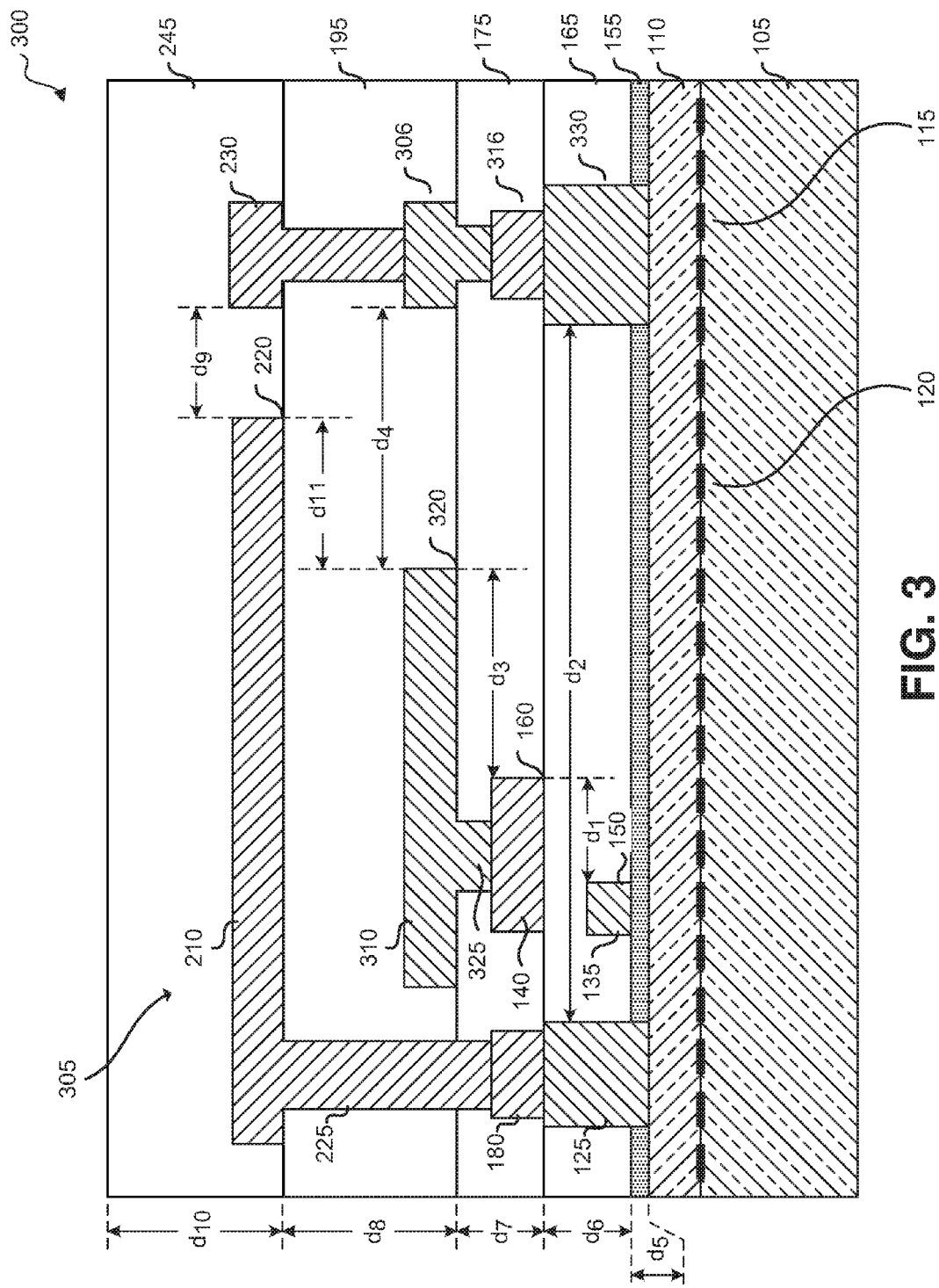
FIG. 3 is a schematic representation of cross-sectional view of a lateral-channel HEMT.

In some implementations, second source-connected plate 210 acts as a so-called "shield wrap." As discussed above, some HEMTs suffer from parasitic dc-to-rf dispersion that is believed to arise at least in part due to the exchange of surface charges with the environment during the high operation. In particular, surface states charge and discharge with relatively slow response times and high frequency operation of the HEMT suffers. Metallic shield wraps can mitigate or eliminate these effects by improving the shielding the surface states and preventing the exchange of surface charges. In some implementations, second source-connected plate 210 acts as a field plate to reduce the peak values of electric fields in HEMT 200, e.g., the electric field between heterojunction 115 and, e.g., bottom, drain-side edge 170 of a source-connected field plate 145 or bottom, drain-side edge 320 of a gate-connected field plate 310 (FIG. 3). In some implementations, second source-connected plate 210 also acts to deplete heterojunction 115 of charge carriers, as discussed further below. In some implementations, second source-connected plate 210 serves in multiple capacities, i.e., acting as two or more of a shield wrap, a field plate, and to deplete heterojunction 115. The particular capacity of second source-connected plate 210 in any device will be a function of any of a number of different geometric, material, and operational parameters. Because of the possibility for source-connected plate 210 to perform one or more roles, it is referred to herein simply as a "source-connected plate."

In the illustrated implementation, second source-connected plate 210 has a generally rectangular cross-section. Second source-connected plate 210 includes a bottom, drain-side edge 220. Drain-side edge 220 is disposed a lateral distance d0+d1+d3+d11 towards drain electrode 130 from a side of source electrode 125 and a vertical distance d5+d6+d7+d8 above second semiconductor material 110. In some implementations, lateral distance d0+d1+d3+d11 is greater than or equal to twice the vertical distance d5+d6+d7+d8. For example, lateral distance d0+d1+d3+d11 can be greater than or equal to three times d5+d6+d7+d8. Drain-side edge 220 is vertically separated from second semiconductor material 110 by the first layer of insulating material 155, second layer of insulating material 165, third layer of insulating material 175, and fourth layer of insulating material 195. As discussed further below, the electric field between second source-connected plate 210 and heterojunction 115 are highest at bottom, drain-side edge 220 under certain bias conditions.

Second source-connected plate 210 can be electrically connected to source electrode 125 in a variety of different ways. In the illustrated implementation, source electrode 125 is electrically connected to second source-connected plate 210 by a source via member 225. In other implementations, source electrode 125 can be electrically connected to second source-connected plate 210 outside of the illustrated cross-section.

In the illustrated implementation, drain 130 is electrically connected to another drain via member 230 by way of via members 185, 190. Drain via member 230 extends through fourth layer of insulating material 195 to a same vertical level as second source-connected plate 210, thus acting as an extension of drain 130. Via member 230, by virtue of being on the same vertical level as second source-connected plate 210, is the nearest extension of drain 130 to second source-connected plate 210. The side of second source-connected plate 210 that includes bottom, drain-side edge 220 is disposed a lateral distance d9 away from the drain via member 230 at the same vertical level. In the illustrated implementation, second source-connected plate 210 and drain via member 230 are covered by a fifth layer of insulating material 245. Fifth layer of insulating material 245 extends a distance d10 from a top surface of fourth layer of insulating material 195.

In some implementations, d1+d3+d4 is between 5 and 35 micrometers, e.g., between 8 and 26 micrometers. In some implementations, lateral distance d9 is between 1 and 10 micrometers, e.g., between 2 and 6 micrometers. In some implementations, second, third, fourth, and fifth layers of insulating material 165, 175, 195, 245 have a composition and quality tailored so that—after extended operation at specified operational parameters so that a steady state is reached—the number of charge defects per area in insulating material layers 165, 175, 195, 245 is less than the sheet carrier density at the heterojunction. In other words, the sum of the products of each three-dimensional defect density of insulating material layers 165, 175, 195, 245 and the respective thickness of that layer is less than the (two-dimensional) sheet carrier density at heterojunction 115. For example, in some implementations, the number of charge defects per area in insulating material layers 165, 175, 195, 245 is less than 20%, e.g., less than 10%, of the sheet carrier density at heterojunction 115.

FIG. 3 is a schematic representation of cross-sectional view of a lateral-channel HEMT 300. In addition to semiconductor materials 105, 110, electrodes 125, 130, 135, and via members 180, 185, 190, 225, 230, HEMT 300 includes a vertically-layered field plate structure 305. Field plate structure 205 is a treble-field plate structure that includes not only gate-connected field plate 140 and second source-connected plate 210, but also a second gate-connected field plate 310. Second gate-connected field plate 310 is electrically connected to gate electrode 135.

In the illustrated implementation, second gate-connected field plate 310 has a generally rectangular cross-section. Second gate-connected field plate 310 includes a bottom, drain-side edge 320. Drain-side edge 320 is disposed a lateral distance d0+d1+d3 towards drain electrode 130 from a side of source electrode 125 and a vertical distance d5+d6+d7 above second semiconductor material 110. Drain-side edge 320 is vertically separated from second semiconductor material 110 by first layer of insulating material 155, second layer of insulating material 165, and third layer of insulating material 175. As discussed further below, the electric field between second-connected field plate 310 and heterojunction 115 are highest at bottom, drain-side edge 320 under certain bias conditions.

Second gate-connected field plate 310 can be electrically connected to gate electrode 135 in a variety of different ways. In the illustrated implementation, second gate-connected field plate 310 is electrically connected to gate-connected field plate 140 by a gate via member 325. Gate-connected field plate 140 is in turn connected to gate 125 outside of the illustrated cross-section. section. In other implementations, second gate-connected field plate 310 can be electrically connected to gate-connected field plate 140 outside of the illustrated cross-section and/or gate electrode 135 and gate-connected field plate 140 can be connected in the illustrated cross-section.

In operation, HEMTs such as HEMTs 100, 200, 300 are switched between the ON state and the OFF state by biasing the respective of gate electrodes 135. In general, HEMTs 100, 200, 300 are depletion mode devices that conduct when the potential difference between the gate and the source is zero. To switch depletion mode devices into the OFF state, the gate is negatively biased with respect to the source. In many applications, it is desirable that the ON state resistance of the HEMT be as low as practical lest, e.g., the power losses in the HEMT become undesirably high and/or the HEMT heat excessively. To reduce the ON state resistance of the HEMT, the gate is generally biased positively with respect to the source.

As a practical matter, it is not possible to apply unduly large potential differences between the gate and the source, even if those potential differences would in theory have some beneficial effects such as, e.g., further reducing the ON state resistance of the HEMT. In particular, the potential differences between the gate and the source are constrained by the interplay of the geometric, material, and operational parameters of the HEMT. For example, excessive potential differences between the gate and the source could lead to degradation and/or dielectric breakdown of the intervening materials having a particular thickness and density, electron spill-over to and trapping in second semiconductor layer 110, and hot electron trapping in first layer of insulating material 155. For this reason, the operational range of potential differences between the gate and the source is constrained to a range of values for a given device in a range of temperature and other operational parameters. This operational range of potential differences between the gate and the source is referred to as the available gate swing amplitude. In many GaN HEMT devices, potential differences on the orders of 1's to 10's of volts are applied between the gate and the source. The available gate swing amplitude is thus generally on the order of 10's of volts. For example, in some GaN HEMT devices, the available gate swing amplitude is 30 volts or less, e.g., 20 volts or less. In depletion mode HEMTs, the available gate swing amplitude ranges from a negative OFF state lower threshold to a positive upper limit. In enhancement mode devices that are in the OFF state when the potential difference between the gate and the source is zero, the available gate swing amplitude can range from zero potential difference lower threshold up to a positive value upper limit.

In contrast, in many power-switching applications, the potential difference between the source and the drain $\Delta V_{SD}$ of a HEMT can be on the order of 100's of volts, e.g., above 500 $V_{DC}$, e.g., around 650 $V_{DC}$. If the gate swing amplitude is on the order of 10's of volts in such applications, then the magnitude of the potential difference between both the source and the drain $\Delta V_{SD}$ and the source and the gate $\Delta V_{SG}$ is significantly larger than the magnitude of the potential difference between the gate and the source. In light of this, the schematic representations of in the following graphs are interchange edges 170, 320 notwithstanding the fact that— in real world devices—differences will exist.

FIGS. 4A, 4B are graphs 405, 410 that schematically represent, respectively, the voltage and electric field at the heterojunction between the source and the drain of some implementations of HEMTs in an OFF-state. The HEMT implementations include at least a dual-field plate structure (e.g., FIG. 1) or a treble- or higher-field plate structure (e.g., FIGS. 2, 3). It is to be understood that graphs 405, 410 are highly schematic representations in that the voltage and electric field are a function of variety of parameters, including but not limited to geometric parameters (including, e.g., number, dimensions, and arrangement of HEMT features), material parameters (including, e.g., dielectric constants of materials, material density, work functions, dopant concentration, defect concentration, surface state composition, and surface state concentration),and operational parameters (including, e.g., temperature, gate voltage, and source-drain voltage). Moreover, even for a single device, such parameters may change over time, e.g., as the device ages or as operational states change. The slopes of the lines, the magnitude of peaks, the number of peaks, and other characteristics will thus vary, e.g., depending on the particular device and operating conditions. Graphs 405, 410 thus should be interpreted as schematic representations for didactic, illustrative purposes.

Graph 405 includes an axis 410 and an abscissa 415. Vertical position along axis 410 denotes voltage. Lateral position along abscissa 415 denotes lateral position along the heterojunction of a HEMT between the source and the drain. Graph 420 includes an axis 425 and an abscissa 430. Vertical position along axis 425 denotes the magnitude of the electric field. Lateral position along abscissa 430 denotes lateral position along the heterojunction of the HEMT between the source and the drain. Lateral position along abscissae 415, 430 is referenced to edges 150, 160, 170, 320 of HEMTs 100, 200, 300 (FIGS. 1, 2, 3) for illustrative purposes.

Under the illustrated parameters, the heterojunction is essentially conductive in the vicinity 420 of the source and is found at a voltage that approximately equals the source voltage VS. Accordingly, the electric field in the vicinity 420 of the source is approximately zero. Under the illustrated bias conditions—wherein the gate is biased to locally deplete charge carriers from the heterojunction—the electrical impedance per unit of length of the heterojunction increases in the vicinity of the gate and reaches a local maximum almost directly beneath the bottom, drain-side edge 150 of the gate. The localized depletion of charge carriers in the vicinity of bottom, drain-side edge 150 of the gate gives rise to a voltage change 425 and a local maximum 430 in the electric field.

The depletion of the charge carriers from the heterojunction by the gate reduces moving toward the drain. Hence, the change in potential per unit length and electric field of the heterojunction both decrease. However, under the illustrative parameters—wherein the gate-connected field plate is also disposed and biased to locally deplete charge carriers from the heterojunction—the electrical impedance per unit of length of the heterojunction again increases and reaches a local maximum almost directly beneath the bottom, drain-side edge 160 of the gate-connected field plate. The increased electrical impedance in the vicinity of the gate-connected field plate causes a relatively higher change 435 in voltage per unit length and a local maximum 440 in the electric field.

The depletion of the charge carriers from the heterojunction by the gate-connected field plate also reduces moving toward the drain. Hence, the change in potential per unit length and electric field of the heterojunction both decrease. However, under the illustrative parameters—wherein the source—connected field plate is also disposed and biased to locally deplete charge carriers from the heterojunction—the electrical impedance per unit of length of the heterojunction again increases and reaches a local maximum almost directly beneath the bottom, drain-side edge 170 of source-connected field plate 145 or the bottom, drain-side edge 320 of gate-connected field plate 310. The increased electrical impedance in the vicinity of the source-connected plate causes a relatively higher change 445 in voltage per unit length and a local maximum 450 in the electric field.

Under the illustrative parameters, the depletion of the charge carriers from the heterojunction by the source-connected field plate also reduces moving toward the drain. The heterojunction becomes essentially conductive in the vicinity 455 of the drain and is found at a voltage that approximately equals the drain voltage VD. Accordingly, the electric field in the vicinity 455 of the drain is approximately zero. The entire potential difference between the source and the drain $\Delta V_{SD}$ is supported across the lateral length of the heterojunction and the HEMT is in an OFF (non-conductive) state. As discussed above, FIGS. 4A, 4B are schematic representations for didactic, illustrative purposes. Other HEMTs under other operational conditions may support the potential difference between the source and the drain $\Delta V_{SD}$ in other ways, including having additional or fewer peaks, peaks with different slopes, and peaks of different peaks, as well as other characteristics.

FIGS. 5A, 5B are graphs 505, 510 that schematically represent, respectively, the voltage and electric field at the heterojunction between the source and the drain of some implementations of HEMTs in an ON-state. The HEMT implementations can include a dual-field plate structure (e.g., FIG. 1) or a treble- or higher-field plate structure (e.g., FIGS. 2, 3).Graphs 505, 510 are also schematic representations and the voltage and electric field are a function of variety of parameters and such parameters may change over time.

Graph 505 includes an axis 510 and an abscissa 515. Vertical position along axis 510 denotes voltage. Lateral position along abscissa 515 denotes lateral position along the heterojunction of a HEMT between the source and the drain. Graph 520 includes an axis 525 and an abscissa 530. Vertical position along axis 525 denotes the magnitude of the electric field. Lateral position along abscissa 530 denotes lateral position along the heterojunction of the HEMT between the source and the drain. Lateral position along abscissae 515, 530 is referenced to edges 150, 160, 170, 320 of HEMTs 100, 200, 300 (FIGS. 1, 2, 3) for illustrative purposes.

In the ON state under the illustrated geometric, material, and operational parameters, the heterojunction is conductive and the source and the drain are at essentially the same voltage. Even under the illustrated parameters, the heterojunction does however have a finite, non-zero resistance and the source voltage and the drain voltage are not identical. For illustrative purposes, voltage 535 is represented with a slight but uniformly rising slope and electric field 540 with a minimal but uniform non-zero value, as would be the case if the heterojunction had an ideally uniform resistivity over the entire channel length. This is not necessarily the case. For example, the finite resistivity of the heterojunction may vary with lateral position due to localized variations in contact potentials, carrier density, defect density, and/or other parameters despite being conductive.

As another example, the current at the heterojunction may become space charge limited under certain geometric, material, and operational parameters, e.g., if the number of carriers at the heterojunction is relatively low in comparison with the current that would be conducted by an ideal conductor. A relatively higher potential difference between the source and the drain $\Delta V_{SD}$ and electric field could result. For example, under certain parameters, a relatively higher electric field extends laterally from even an undepleted region underneath the gate electrode toward the drain at or above the knee voltage $\Delta V_{SD} \geq V_{knee}$ for a given drain current level.

In some implementations, distance d3—which characterizes the lateral extension of field plates 145, 310 from the bottom, drain-side edge 160 of gate-connected field plate 140 toward the drain—is less than the lateral extension of this relatively higher electric field toward the drain. Such a limit on the lateral extension of field plates 145, 310 can reduce the electric field which arises between field plates 145, 310 and heterojunction 115. In particular, for a source-connected field plate 145, the full potential difference between the source and the drain $\Delta V_{SD}$ will not be supported across the portions of first layer of insulating material 155, second layer of insulating material 165, and third layer of insulating material 175 along length d3. For a gate-connected field plate 310, the full potential difference between the gate and the drain will not be supported across the portions of first layer of insulating material 155, second layer of insulating material 165, and third layer of insulating material 175 along length d3. By reducing the electric field in this region, breakdown voltages and lifespans of HEMT can be improved.

As discussed above, FIGS. 5A, 5B are thus also schematic representations for didactic, illustrative purposes. The vertical position of voltage 535 along axis 510 will depend upon the deployment of the HEMT, e.g., whether the HEMT is deployed on the high side or low side of a load.

FIGS. 6A, 6B are graphs 605, 620 that schematically represent, respectively, the voltage and electric field at the heterojunction between the source and the drain of some implementations of HEMTs in an OFF-state for fixed source and gate potential but a variety of different discrete drain potentials VD1, VD2, VD3, VD4. Graphs 605, 620 are highly schematic representations that are presented for didactic, illustrative purposes. The HEMT implementations can include a dual-field plate structure (e.g., FIG. 1) or a treble- or higher-field plate structure (e.g., FIGS. 2, 3).

Graph 605 includes an axis 610 and an abscissa 615. Vertical position along axis 610 denotes voltage. Lateral position along abscissa 615 denotes lateral position along the heterojunction of a HEMT between the source and the drain. Graph 620 includes an axis 625 and an abscissa 630. Vertical position along axis 625 denotes the magnitude of the electric field. Lateral position along abscissa 630 denotes lateral position along the heterojunction of the HEMT between the source and the drain. Lateral position along abscissae 615, 630 is referenced to edges 150, 160, 170, 320 of HEMTs 100, 200, 300 (FIGS. 1, 2, 3) for illustrative purposes.

In the OFF state, the potential difference between the source and the drain $\Delta V_{SD}$ is supported across the lateral length of the heterojunction. However, depending on the geometric, material, and operational parameters of the HEMT, the extent of the localized depletion of charge carriers can vary. Correspondingly, the voltage changes 425 and a local maximum 430 in the vicinity of bottom, drain-side edge 150, the voltage changes 435 and local maximum 440 in the vicinity of the bottom, drain-side edge 160, and the voltage changes 445 and local maximum 450 in the vicinity of the bottom, drain-side edges 170, 320 can also vary since the potential difference between the source and the drain $\Delta V_{SD}$ varies.

Although graphs 605, 620 are highly schematic representations, it is noted that the local maximum 430 in the electric field in the vicinity of bottom, drain-side edge 150 of gate 135 begins to saturate at the higher potential differences between the source and the drain $\Delta V_{SD}$ represented in graph 620. In other words, at relatively lower potential differences between the source and the drain $\Delta V_{SD}$ (e.g., at drain voltages below VD1 and between VD1, VD2), increases in potential differences between the source and the drain $\Delta V_{SD}$ also lead to increases in the local maximum 430 in the electric field in the vicinity of bottom, drain-side edge 150 of gate 135. In contrast, at relatively higher potential differences between the source and the drain $\Delta V_{SD}$ (e.g., at drain voltages between VD3, VD4), increases in potential differences between the source and the drain $\Delta V_{SD}$ lead to smaller or even no increase in the local maximum 430 in the electric field in the vicinity of bottom, drain-side edge 150 of gate 135. This saturation or "cut-off" of the incremental change in local maximum 430 of the electric field with increasing drain potential corresponds to complete depletion of charge carriers in the vicinity of bottom, drain-side edge 160 of gate-connected field plate 140.

In some implementations, the geometric and material properties of the HEMT can be tailored so that the gate edge field increment cut-off for common operational conditions, e.g., within 150 degrees Celsius of room temperature, or within 125 degrees Celsius of room temperature. For example, the geometric and material properties of the HEMT can be tailored so that the gate edge field increment is cut-off at drain potentials relative to the source of greater than the absolute value of the gate swing amplitude. Thus, at least some of the geometric and material properties that determine the gate swing amplitude are related to the cut-off of the gate edge field increment, which is itself in part determined by the interplay of at least some of those same geometric and material properties. By tailoring the geometric and material properties in this way, the maximum electric field in the channel near drain-side edge 150 of gate 135 can be limited, thus reducing or preventing the ionization of the deep centers in semiconductor materials 105 and/or 110. This reduces or even prevents related dispersion, or collapse effects, and reduces or eliminates the likelihood that avalanche breakdown will occur in semiconductor materials 105 and/or 110.

As another example, in some implementations, the geometric and material properties of the HEMT can be tailored so that the gate edge field increment is cut-off for those same operational conditions at drain potentials relative to the source of greater than 2 times the absolute value of the gate swing amplitude, e.g., between 2-5 times the absolute value of the gate swing amplitude or between 3-4 times the absolute value of the gate swing amplitude. By tailoring the such geometric and material properties in this way, the above-noted benefits are more likely to be achieved.

FIG. 7 is a graph 720 that schematically represents the electric field at the heterojunction between the source and the drain of some implementations of HEMTs in an OFF-state for fixed source and gate potential but a variety of different discrete drain potentials VD4, VD5, VD6, VD7. Graph 720 is a highly schematic representation that is presented for didactic, illustrative purposes. The HEMT implementations can include a dual-field plate structure (e.g., FIG. 1) or a treble- or higher-field plate structure (e.g., FIGS. 2, 3).

Graph 720 includes an axis 725 and an abscissa 730. Vertical position along axis 725 denotes the magnitude of the electric field. Lateral position along abscissa 730 denotes lateral position along the heterojunction of the HEMT between the source and the drain. Lateral position along abscissa 730 is referenced to edges 150, 160, 170, 320 of HEMTs 100, 200, 300 (FIGS. 1, 2, 3) for illustrative purposes.

In the OFF state, the potential difference between the source and the drain $\Delta V_{SD}$ is supported across the lateral length of the heterojunction. However, depending on the geometric, material, and operational parameters of the HEMT, the extent of the localized depletion of charge carriers can vary.

Although graph 720 is a highly schematic representation, it is noted that both:

the local maximum 430 in the electric field in the vicinity of bottom, drain-side edge 150 of gate 135 is saturated at all of the illustrated potential differences between the source and the drain $\Delta V_{SD}$, and the local maximum 440 in the electric field in the vicinity of bottom, drain-side edge 160 of gate-connected field plate 140 begins to saturate at the higher potential differences between the source and the drain $\Delta V_{SD}$ represented in graph 720.

In other words, at relatively lower potential differences between the source and the drain $\Delta V_{SD}$ (e.g., at drain voltages below VD4 and between VD4, VD5), increases in potential differences between the source and the drain $\Delta V_{SD}$ also lead to increases in the local maximum 440 in the electric field in the vicinity of bottom, drain-side edge 160 of gate-connected field plate 140. In contrast, at relatively higher potential differences between the source and the drain $\Delta V_{SD}$ (e.g., at drain voltages between VD6, VD7), increases in potential differences between the source and the drain $\Delta V_{SD}$ lead to smaller or even no increase in the local maximum 440 in the electric field in the vicinity of bottom, drain-side edge 160 of gate-connected field plate 140. This saturation or "cut-off" of the incremental change in local maximum 440 of the electric field with increasing drain potential corresponds to complete depletion of charge carriers in the vicinity of the respective of bottom, drain-side edge 170, 320.

In some implementations, the geometric and material properties of the HEMT (including distance d3) can be tailored so that the gate edge field increment cut-off for common operational conditions, e.g., within 150 degrees Celsius of room temperature, or within 125 degrees Celsius of room temperature. For example, the geometric and material properties of the HEMT (including distance d3) can be tailored so that the gate-connected field plate increment is cut-off at drain potentials that are greater than the drain potential at which the gate edge field increment is cut-off. For example, this potential difference can be greater than twice the drain potential at which the gate edge field increment is cut-off, e.g., between three and five times the drain potential at which the gate edge field increment is cut-off. Thus, at least some of the geometric and material properties that determine the gate edge field increment cut off are related to the cut-off of the gate-connected field plate increment, which is itself in part determined by the interplay of at least some of those same geometric and material properties. By tailoring the geometric and material properties in this way, the maximum electric field in the channel near drain-side edge 160 of gate-connected field plate 140 can be limited, thus reducing or preventing the ionization of the deep centers in semiconductor materials 105 and/or 110. This reduces or even prevents related dispersion, or collapse effects, and reduces or eliminates the likelihood that avalanche breakdown will occur in semiconductor materials 105 and/or 110.

As another example, in some implementations, the geometric and material properties of the HEMT (including distance d3) can be tailored so that the gate-connected field plate increment is cut off at drain potentials relative to the source of greater than 2.5 times the drain potentials at which the gate edge field increment is cut-off, e.g., five times the drain potentials at which the gate edge field increment is cut-off, or even ten times the drain potentials at which the gate edge field increment is cut-off. By tailoring the geometric and material properties in this way, the above-noted benefits are more likely to be achieved.

Figure 8:
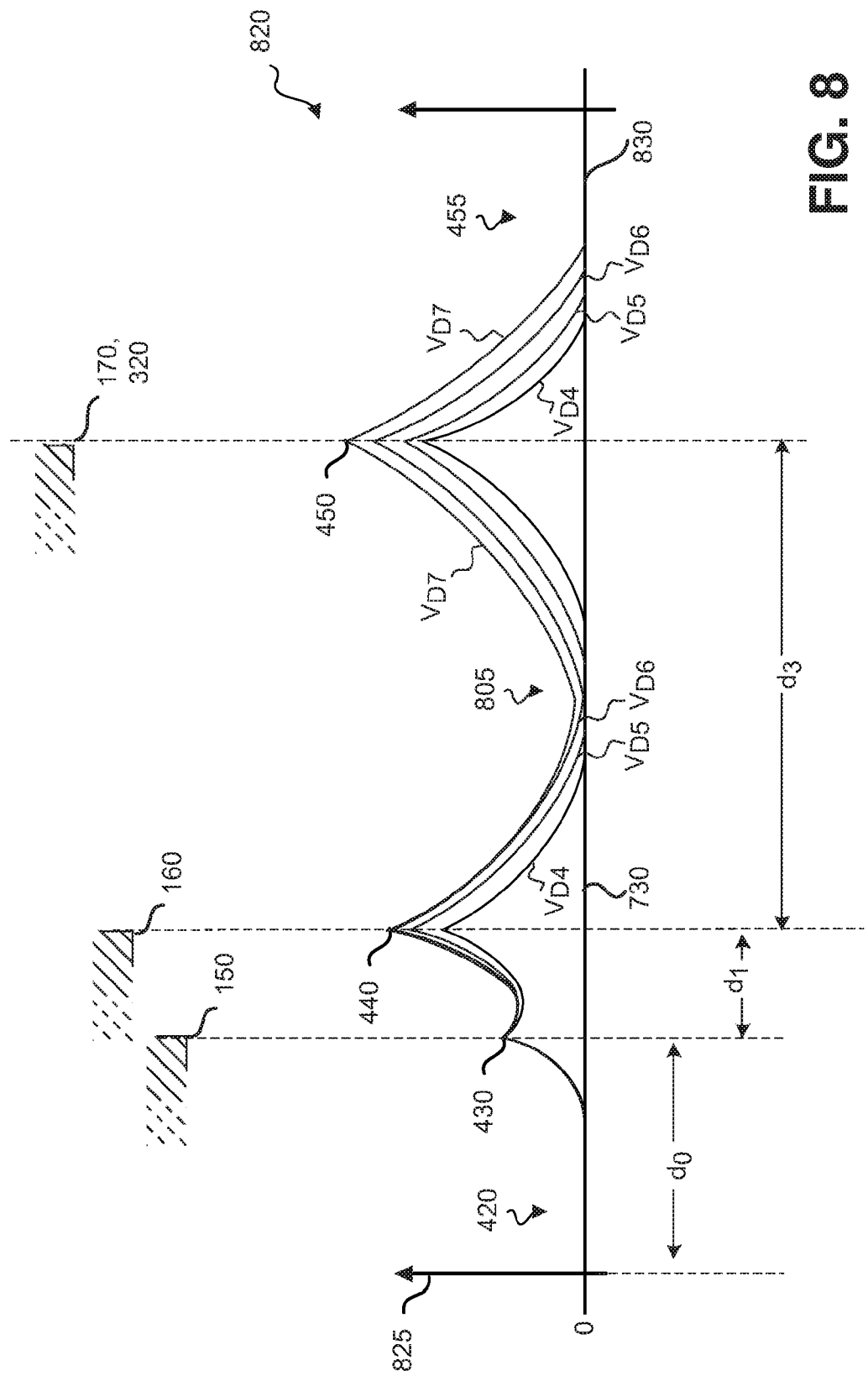
FIG. 8 is a graph that schematically represents the electric field at the heterojunction between the source and the drain of some implementations of HEMTs in an OFF-state for fixed source and gate potential but a variety of different discrete drain potentials.

FIG. 8 is a graph 820 that schematically represents the electric field at the heterojunction between the source and the drain of some implementations of HEMTs in an OFF-state for fixed source and gate potential but a variety of different discrete drain potentials VD4, VD5, VD6, VD7. Graph 720 is a highly schematic representation that is presented for didactic, illustrative purposes. The HEMT implementations can include a dual-field plate structure (e.g., FIG. 1) or a treble- or higher-field plate structure (e.g., FIGS. 2, 3).

Graph 820 includes an axis 825 and an abscissa 830. Vertical position along axis 825 denotes the magnitude of the electric field. Lateral position along abscissa 830 denotes lateral position along the heterojunction of the HEMT between the source and the drain. Lateral position along abscissa 830 is referenced to edges 150, 160, 170, 320 of HEMTs 100, 200, 300 (FIGS. 1, 2, 3) for illustrative purposes.

The potential difference between the source and the drain $\Delta V_{SD}$ is supported across the lateral length of the heterojunction in the OFF state. However, although graph 820 is a highly schematic representation, it is noted that the electric field that extends laterally towards the drain from bottom, drain-side edge 160 of gate-connected field plate 140 does not reach the electric field that extends laterally towards the source from bottom, drain-side edge 170, 320 until the local maximum 440 in the electric field in the vicinity of bottom, drain-side edge 160 of gate-connected field plate 140 begins to saturate at the higher potential differences between the source and the drain $\Delta V_{SD}$. In other words, at relatively lower potential differences between the source and the drain $\Delta V_{SD}$ (e.g., at drain voltages below VD4 and between VD4, VD5), a portion 805 of the heterojunction remains essentially conductive and the electric field in portion 805 is approximately zero. In contrast, at relatively higher potential differences between the source and the drain $\Delta V_{SD}$ (e.g., at drain voltages between VD6, VD7 and greater than VD7), localized depletion—and the concomitant electric field—arising from drain-side edge 160 and drain-side edge 170, 320 overlap and the conductivity of portion 805 is reduced.

The geometric and material properties of the HEMT (including distance d3) can be tailored so that—for common operational conditions—a portion 805 of the heterojunction remains essentially conductive with increasing potential differences between the source and the drain $\Delta V_{SD}$ until the local maximum 440 in the electric field in the vicinity of bottom, drain-side edge 160 of gate-connected field plate 140 begins to saturate. One example of such operational conditions are, e.g., within 150 degrees Celsius of room temperature, or within 125 degrees Celsius of room temperature. By tailoring the geometric and material properties, the maximum electric field in the channel near drain-side edge 160 of gate-connected field plate 140 can be limited, thus reducing or preventing the ionization of the deep centers in semiconductor materials 105 and/or 110.

Figure 9:
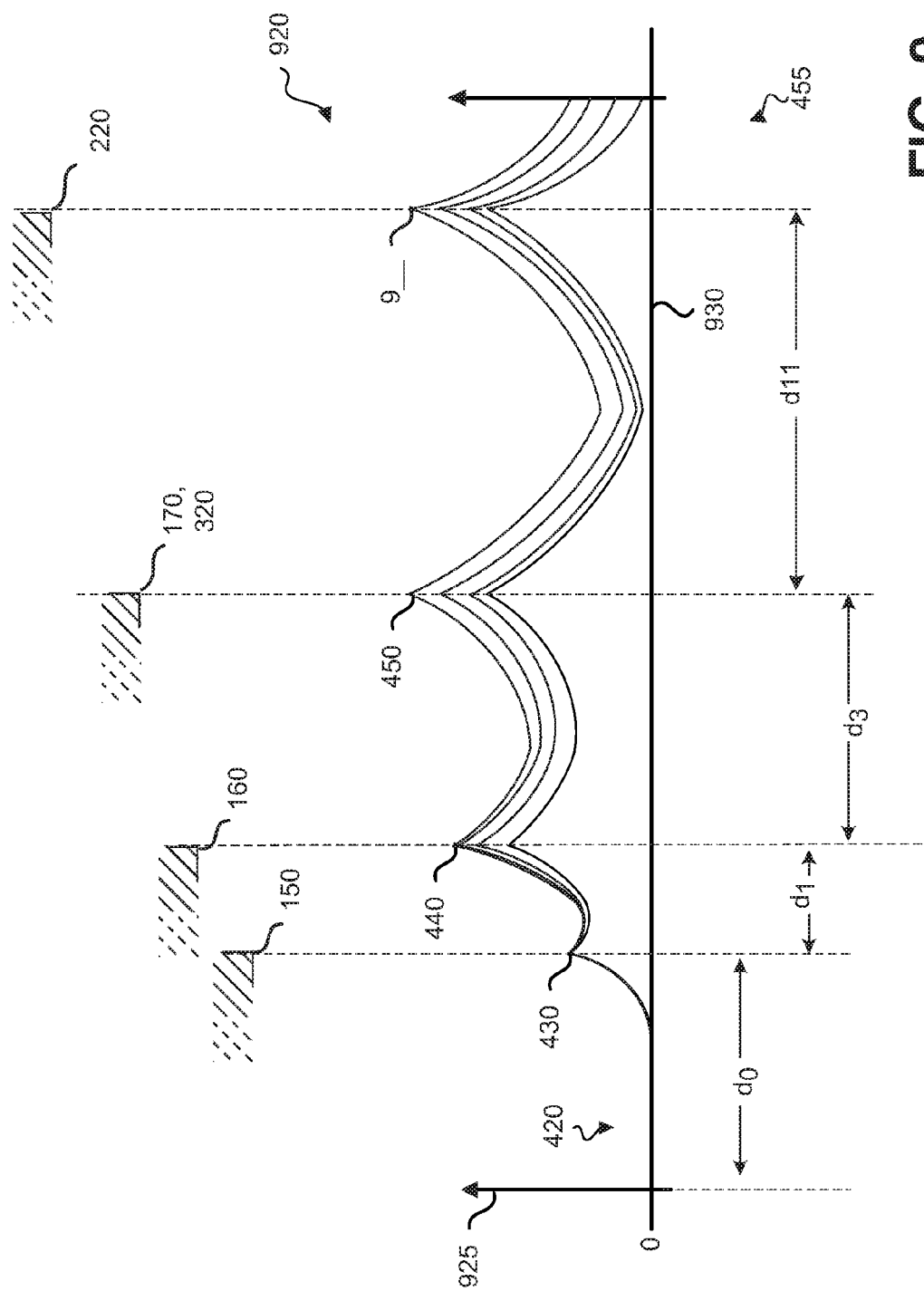
FIG. 9 is a graph that schematically represents the electric field at a heterojunction of some implementations of HEMTs in an OFF-state for fixed source and gate potential but a variety of different discrete drain potentials.

FIG. 9 is a graph 920 that schematically represents the electric field at the heterojunction between the source and the drain of some implementations of HEMTs in an OFF-state for fixed source and gate potential but a variety of different discrete drain potentials. Graph 920 is a highly schematic representation that is presented for didactic, illustrative purposes. The HEMT implementations include a treble- or higher-field plate structure (e.g., FIGS. 2, 3).

Graph 920 includes an axis 925 and an abscissa 930. Vertical position along axis 925 denotes the magnitude of the electric field. Lateral position along abscissa 930 denotes lateral position along the heterojunction of the HEMT between the source and the drain. Lateral position along abscissa 930 is referenced to edges 150, 160, 170, 320, 220 of HEMTs 200, 300 (FIGS. 2, 3) for illustrative purposes.

The potential difference between the source and the drain $\Delta V_{SD}$ is supported across the lateral length of the heterojunction in the OFF state. Under the illustrative parameters, bottom, drain-side edge 220 of second source-connected plate 210 also depletes of the charge carriers from the heterojunction and gives rise to an electric field in vicinity 455 of the drain. The geometric and material properties of the HEMT can thus be tailored so that—for common operational conditions—a portion of the heterojunction in vicinity 455 of the drain is depleted due to the vertically-oriented voltage difference between the heterojunction and second source-connected plate 210. One example of such operational conditions are, e.g., within 150 degrees Celsius of room temperature, or within 125 degrees Celsius of room temperature.

By tailoring the geometric and material properties in this way, the potential difference and hence electric field between the heterojunction and second source-connected plate 210 can be reduced while the device is in the OFF state. In particular, because some portion of the potential difference between the source and the drain $\Delta V_{SD}$ is dropped along heterojunction 115 in vicinity 455 of the drain, the full potential difference between the source and the drain $\Delta V_{SD}$ is not applied between second source-connected plate 210 and the portion of heterojunction 115 that underlies second source-connected plate 210. Instead, a lower potential difference exists which, e.g., reduces the likelihood of charge injection into intervening insulating material(s) and/or dielectric breakdown.

In some implementations, HEMTs have geometric and material properties that are tailored to operate at least the maximum specified potential difference between the source and the drain $\Delta V_{SD}$ between the heterojunction and second source-connected plate 210 for at least short periods of time. In particular, although HEMTs may spend a relatively large percentage of their operational lifetimes in the OFF state, potentials approaching the maximum operational potential difference between the source and the drain $\Delta V_{SD}$ may transiently appear between the heterojunction and second source-connected plate 210 during switching. Without wishing to be bound by any theory, it is believed that the depletion and (re-) accumulation processes at the heterojunction may not occur uniformly along the entire lateral length of the heterojunction. For example, in the context of switching between an OFF state and an ON state, a portion of heterojunction 115 in vicinity 455 of the drain may (re-) accumulate charge more rapidly than other portions of heterojunction 115. In this case, heterojunction could become conductive in the vicinity 455 of the drain before other portions of heterojunction 115. During this transient state, the drain voltage VD could extend into vicinity 455 and the entire potential difference between the source and the drain $\Delta V_{SD}$ would be supported between the second source-connected plate 210 and underlying portion of the heterojunction 115.

A number of implementations have been described. Nevertheless, it is to be understood that various changes are to be made. For example, although the illustrated implementations are all lateral-channel HEMTs, the same techniques can be applied to vertical-channel HEMTs provided that a vertical heterojunction can be formed. Accordingly, other implementations are within the scope of the appended claims.

What is claimed is:

1. A high-electron-mobility transistor (HEMT) comprising:
   a first semiconductor material and a second semiconductor material disposed to form a heterojunction at which a two-dimensional electron gas arises;
   a source electrode, a drain electrode, and a gate electrode, the gate electrode disposed to regulate conduction in the heterojunction between the source electrode and the drain electrode, the gate having a drain-side edge;
   a vertical layered filed plate structure comprising at least one gate-connected field plate and at least one source connected field plate;
      wherein, in the OFF state and at a potential difference between the source and the drain in excess of the absolute value of a gate swing amplitude, charge carriers are depleted from a portion of the heterojunction in a vicinity of the drain-side edge of at least one gate-connected field plate, the depletion of charge carriers effective to saturate a lateral electric field in the heterojunction in a vicinity of the drain-side edge of the gate electrode.

2. The HEMT of claim 1, wherein
the vertical layered filed plate structure comprises a first field plate having a drain-side edge;
a second field plate having a drain-side edge;
and a third filed plate having a drain-side edge.

3. The HEMT of claim 2, wherein
the first field plate is disposed above a drain-side edge of the gate electrode and extending laterally toward the drain;
the second field plate disposed above a drain-side edge of the first field plate and extending laterally toward the drain;
and the third filed plate disposed above a drain-side edge of the second field plate and extending laterally toward the drain.

4. The HEMT of claim 2, wherein
the first field plate is a gate-connected field plate,
the second filed plate is a gate-connected field plate, and
the third field plate is a source-connected filed plate.

5. The HEMT of claim 3, wherein the first field plate is connected to the gate electrode.

6. The HEMT of claim 3, wherein the second field plate is electrically connected to the first field plate via a gate member.

7. The HEMT of claim 2, wherein, in the OFF-state and at potential differences between the source and the drain that exceed a potential difference between the source and the drain at which charge carriers are depleted from a portion of the heterojunction in a vicinity of the drain-side edge of the second field plate, a portion of the heterojunction in a vicinity of the drain is depleted due to the vertically-oriented voltage difference between the heterojunction and the third field plate.

8. The HEMT of claim 2, wherein, in the OFF state:
a first electric field in the heterojunction extends drain-ward from a drain-side edge of the first field plate;
a second electric field in the heterojunction extends source-ward from a drain-side edge of the second field plate ; and
the first electric field first overlaps with the second electric field only at potential differences between the source and the drain that exceed a potential difference between the source and the drain at which charge carriers are depleted from a portion of the heterojunction in a vicinity of the drain-side edge of the second field plate.

9. The HEMT of claim 1, wherein:
the HEMT includes one or more layers of insulating material above the first and second semiconductor material;
a sheet carrier density arises at the heterojunction; and
after a steady state is reached after extended operation at specified operational parameters, a number of number of charge defects per unit area in the layers of insulating material is less than the sheet carrier density.

10. The HEMT of claim 1, wherein the drain-side edge of the second field plate is vertically separated from the second semiconductor material by the layers of insulating material.

11. The HEMT of claim 1, wherein second field plate has a rectangular cross-section and a bottom.

12. The HEMT of claim 1, wherein the electric field between second field plate and the heterojunction are highest at bottom, drain-side edge under certain bias conditions.

13. The HEMT of claim 1, wherein the first and second semiconductor materials are GaN and AlGaN, respectively.

* * * * *